United States Patent
El Hajji (12)

(10) Patent No.: US 6,177,694 B1
(45) Date of Patent: Jan. 23, 2001

(54) DYNAMIC RANDOM ACCESS MEMORY DEVICE

(75) Inventor: Noureddine El Hajji, Grenoble (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/170,611

(22) Filed: Oct. 13, 1998

(30) Foreign Application Priority Data

Oct. 14, 1997 (FR) .................................................. 97 12818

(51) Int. Cl.⁷ .................................................. H01L 29/72
(52) U.S. Cl. .................. 257/296; 257/297; 257/369; 257/390; 257/401
(58) Field of Search .................. 257/296, 297, 257/369, 390, 401

(56) References Cited

U.S. PATENT DOCUMENTS 4,023,149 * 5/1977 Bormann et al. .................. 257/238

FOREIGN PATENT DOCUMENTS 0681331A  11/1995  (EP) .......................... H01L/27/108

* cited by examiner

*Primary Examiner*—Edward Wojciechowicz
(74) *Attorney, Agent, or Firm*—Theodore E. Galanthay; Allen, Dyer, doppelt, Milbrath & Gilchrist, P.A.

(57) ABSTRACT

Each memory cell of the memory includes four insulated-gate field-effect transistors comprising two storage transistors both possessing the same first quotient or ratio of their channel width to their channel length. The four transistors also include two access transistors both possessing the same second quotient or ratio of their channel width to their channel length. The ratio of the first quotient to the second quotient is greater than or equal to one.

32 Claims, 2 Drawing Sheets

DYNAMIC RANDOM ACCESS MEMORY DEVICE

FIELD OF THE INVENTION

The present invention relates to memories, and, more particularly, to dynamic random access memories (DRAMs).

BACKGROUND OF THE INVENTION

Unlike static random access memories (SRAMs) in which the information stored remains so indefinitely at least as long as these memories remain energized, dynamic memories have the particular feature of requiring periodic refreshing of the information stored because of the stray leakage currents which discharge the storage capacitor of each memory cell (memory slot). This refreshing is conventionally performed in the course of a read/re-write cycle consequently requiring a specific phase for re-writing the data read.

Among the known memory cells for dynamic random access memories, mention may be made in particular of those containing two or three transistors, and those containing a single transistor, the information in which is moreover destroyed by reading.

SUMMARY OF THE INVENTION

An object of the invention is to provide a radically different structure of a memory cell of a dynamic random access memory allowing, in particular, automatic refreshing of the data read—this automatic refreshing, therefore, not requiring any specific re-write phase. Moreover, the reading of data from the memory cell according to the invention does not destroy this data.

Another object of the invention is also to propose a memory structure in which the area occupied by the circuits required to read/write the memory plane ("overhead") is less than that of the corresponding circuits associated with known dynamic random access memories.

Yet another object of the invention is to propose a memory structure which uses a smaller number of metallization levels, thus decreasing the probability of a structural defect.

The invention therefore proposes a dynamic random access memory device comprising memory cells organized in rows and columns, and in which each memory cell comprises four insulated-gate field-effect transistors. These four transistors are made up of two storage transistors and two access transistors. The two storage transistors both possess the same quotient or ratio of their channel width W1 to their channel length L1, and the two access transistors both possess the same quotient or ratio of their channel width W2 to their channel length L2. The ratio of the first quotient W1/L1 to the second quotient W2/L2 is greater than or equal to 1 and, preferably greater than or equal to 2.

As will be seen in greater detail below, the memory cell with four transistors according to the invention can be "refreshed", read or written. However, in fact, the refresh is performed at the start of the read cycle so that the memory cell is automatically refreshed when it is read. Now, in the course of this operation, a voltage spike appears on the side of the node which had been taken to zero potential during writing. Additionally, if this voltage spike is too large, the memory cell may lose its data, refresh in the wrong direction and ultimately read out erroneous data. Choosing the above mentioned ratio of the two quotients W/L makes it possible to avoid such a malfunction.

According to one embodiment of the invention, each memory cell comprises a first input and a second input for respectively receiving, during the read and write phases, two control voltages (corresponding to the voltages applied to a first column metallization or "bit line" and to an immediately adjacent reference column metallization). Each memory cell also comprises a selection input for receiving a row selection voltage conveyed by a specific row metallization ("wordline"). Furthermore, the source of a first access transistor is connected to the first input, while the source of the second access transistor is connected to the second input. The drain of the first access transistor is connected to the drain of a first storage transistor and to the gate of the second storage transistor, while the drain of the second access transistor is connected to the drain of the second storage transistor and to the gate of the first storage transistor. The sources of the two storage transistors are together connected to a first bias voltage (for example, ground in the case of NMOS transistors or else the high voltage level VDD in the case of PMOS transistors). Lastly, the gates of the two access transistors are connected to the selection input and consequently to the wordline. The four transistors may be NMOS transistors or PMOS transistors.

To reduce the leakage currents especially through the drain-source path of the storage transistors, and hence to improve the retention time of the stored data, it is possible to bias the substrate of all the transistors suitably so as to obtain, using the "substrate effect", an increase in the threshold voltage and consequently an increase in retention time. Within the meaning of the invention, the term "substrate" (or "bulk") denotes the substrate proper when the transistor is not placed in a well, or indeed the well if there is one. More precisely, in the case of NMOS transistors, the well will advantageously be biased negatively, while in the case of PMOS transistors the well will advantageously be biased to a voltage greater than the voltage VDD.

More generally, the substrates of all the transistors are preferably connected to a second predetermined bias voltage, and the first and second bias voltages are chosen so that the difference between the second bias voltage and the first bias voltage is negative or zero in the case of NMOS transistors, while remaining greater than the additive inverse of the threshold voltage of the transistors. In the case of PMOS transistors, the difference between the second bias voltage and the first bias voltage is chosen to be positive or zero, while remaining less than the sum of the first bias voltage and the threshold voltage of the transistors.

BRIEF DESCRIPTION OF THE DRAWINGS

Other advantages and characteristics of the invention will emerge on examining the detailed description of an entirely non-limiting embodiment and of the appended drawings in which.

DETAILED DESCRIPTION OF THE PREFERRED EMBODIMENTS

Figure 1:
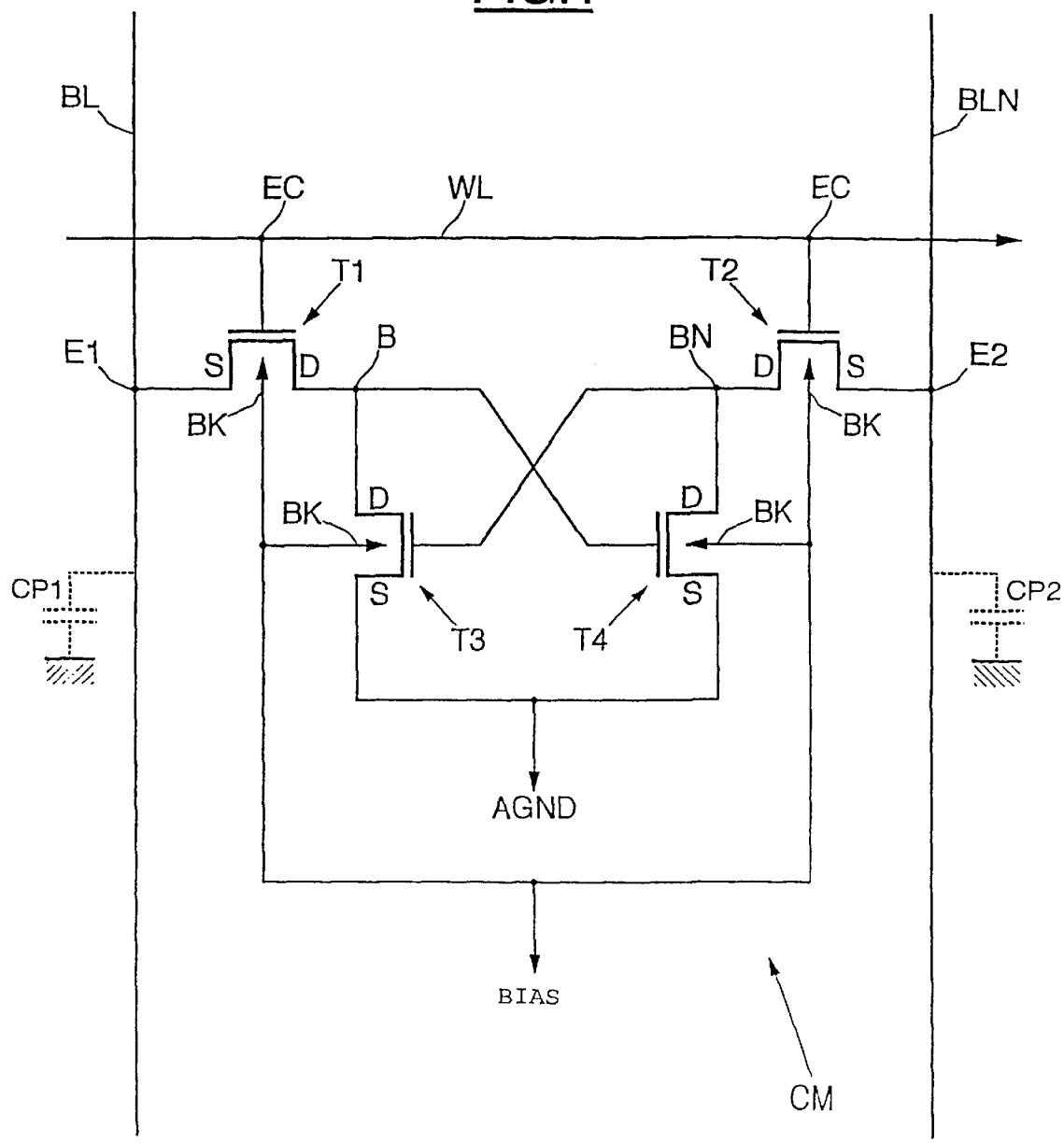
FIG. 1 is a diagrammatic representation of a memory cell according to the invention constructed from NMOS transistors, and FIG. 2 diagrammatically illustrates a cell read cycle comprising an automatic refreshing of the stored data.

For the purposes of simplification, FIG. 1 represents just a single memory cell CM. Of course, those skilled in the art are aware that these memory cells are organized in rows and columns so as to form the memory plane of the dynamic random access memory. More precisely, each memory cell comprises two inputs E1 and E2 respectively connected to two adjacent column metallizations BL and BLN, to receive control voltages for reading and writing the data stored in the memory cell. Moreover, in a conventional manner, each memory cell is selected by a signal WL conveyed by a row metallization or "wordline". In this respect, the memory cell CM comprises two NMOS access transistors, labeled T1 and T2 respectively, the respective gates of which are connected to the wordline, the corresponding nodes EC thus forming a selection input for this memory cell.

In addition to the two access transistors T1 and T2, the memory cell CM comprises two NMOS storage transistors T3 and T4. The capacitance for storing the data in the memory is formed by the gate/source capacitance of a storage transistor. The gate of the transistor T4, as well as the drain of the transistor T3, are connected to the drain of the access transistor T1, the corresponding node being labeled B. Similarly, the gate of the storage transistor T3, as well as the drain of the storage transistor T4, are connected to the drain of the access transistor T2, the corresponding node being labeled BN.

The respective sources and the access transistors T1 and T2 are connected respectively to the two control inputs E1 and E2. Lastly, the sources of the two storage transistors T3 and T4 are together connected to a first predetermined bias voltage AGND. Furthermore, the substrate BK of each transistor of the memory cell, or indeed the well BK of this transistor if the latter is disposed inside a well, is advantageously connected to a second bias voltage BIAS. This being so, it is particularly advantageous for the transistors of the memory cell CM to be placed in a well (or even in a double well) constructed within a semiconductor substrate. This embodiment has the advantage of offering less leakage current, of being less sensitive to the "noise" originating from the substrate, and of being less sensitive to alpha particles.

To limit the losses of charge from the storage capacitors of the storage transistors, and consequently to increase the retention time of a stored data, the voltages BIAS and AGND are advantageously chosen in such a way that these voltages satisfy the following relation:

$$-VT \leq BIAS - AGND < 0$$

in which VT denotes the threshold voltage of the transistors. Such a relation between the voltage BIAS and the voltage AGND leads to a positive "source-substrate" potential difference and this, bearing in mind the "substrate effect" which is well known to those skilled in the art, leads to an increase in the threshold voltage and consequently to an increase in the retention time. In the example described above, with 0.35 μm technology and a zero AGND voltage, a voltage BIAS substantially equal to −VDD/10 will be chosen, that is, to say substantially equal to −0.3 V.

In the case in which the memory cell is constructed from PMOS transistors, the bias voltage AGND is then replaced by the bias voltage AVDD, for example, 3 V. In this case, again to increase the data retention time by using the "substrate effect", the voltages AVDD and BIAS will be chosen in such a way that:

$$VDD + VT \geq BIAS - AVDD \geq 0$$

To illustrate the operation of the memory cell CM in write mode, it is assumed that it is desired to write a logic "1". The cell CM is selected by activating the logic signal WL (WL=1) and voltages equal to VDD and 0 respectively are applied to the metallizations BL and BLN.

Since the access transistors T1 and T2 are on, the voltage at the node B is equal to VDD−VT, while the voltage at the node BN is zero. The storage transistor T3 is, therefore, off while the storage transistor T4 is on. The logic "1" value is consequently stored in the gate/source capacitance of the transistor T4. It should be noted here that since the transistor T3 is off, the voltage at the node B tends to keep its high value (disregarding the leakages from stray currents, of course). Similarly, since the transistor T4 is on, the voltage at the node BN tends to be maintained at its zero level. Consequently, those skilled in the art will appreciate the feature of stability of the memory cell during the write phase. Subsequently, the signal WL is deactivated and the data is then regarded as written.

To write a logic "0", a zero voltage is applied to the metallization BL and a high-level voltage (VDD) is applied to the metallization BLN. It is then the gate-source capacitance of the transistor T3 which stores a charge resulting from the application of the high-level voltage to the node BN.

Figure 2:
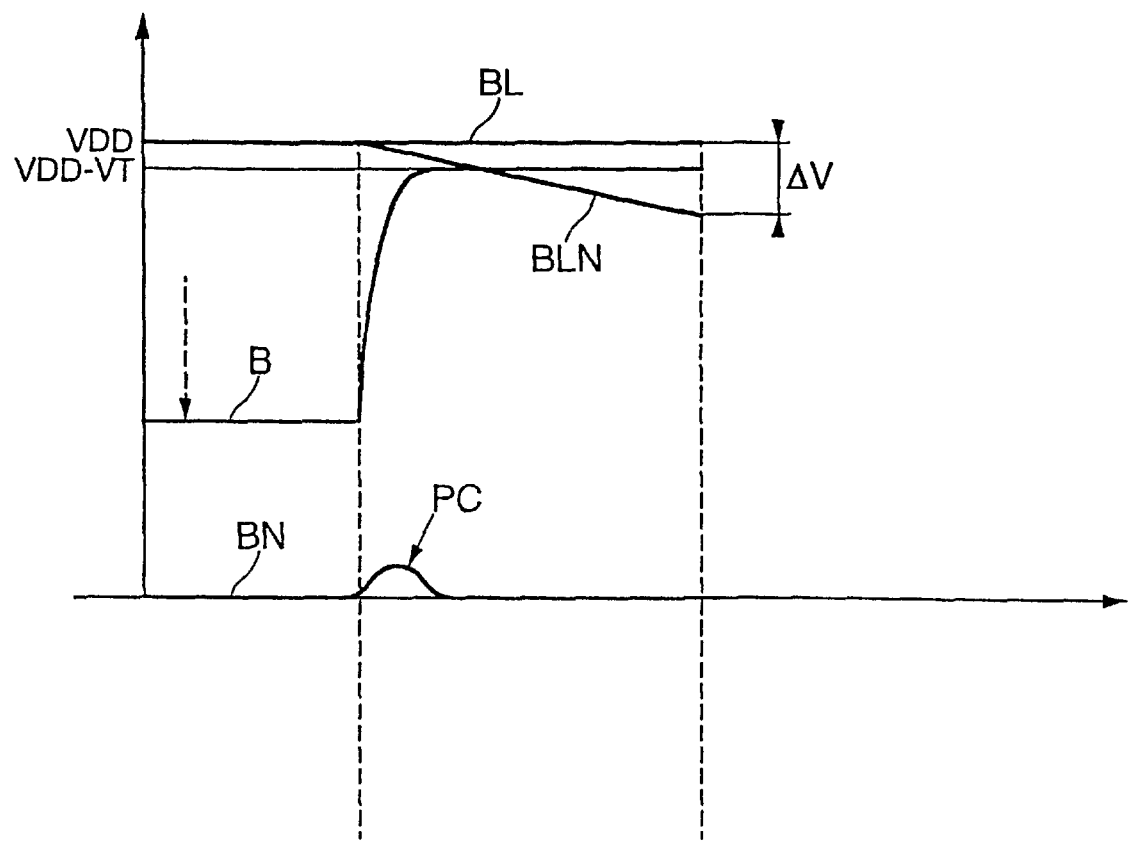

More particular reference is now made to FIG. 2 to illustrate the operation of the memory cell in read mode. In the example which will be described it will be assumed that a logic "1" has previously been stored in the memory cell. In a conventional manner, the first step includes precharging the metallizations BL and BLN to a high voltage level, in this instance VDD, if the precharge circuit comprises PMOS transistors, or else to VDD−VT if the precharge circuit comprises NMOS transistors. It is also assumed that, because of the leakages in the substrate, the potential at the node B has suffered a voltage drop relative to the initial level VDD−VT which was applied to it when writing the logic data.

After deactivating the precharge, the row selection signal WL is activated, this having the effect of turning on the two access transistors T1 and T2. Consequently, a transfer of the charge from the stray capacitor CP1 of the metallization BL to the node B occurs immediately, the effect of this being to take the potential of this node B to its initial value VDD−VT. The smaller the ratio of the gate/source storage capacitance to the stray capacitance CP1 (or CP2), for example, less than 1/50, the shorter is the duration of transfer. This being so in FIG. 2, the charge transfer duration has been deliberately exaggerated. Those skilled in the art will therefore appreciate that the memory cell according to the invention has the noteworthy property that the data stored is automatically and almost immediately refreshed at the start of a read cycle. It is, therefore, unnecessary to provide a specific read re-write cycle to refresh the stored data. Moreover, after activation of the signal WL, there is a fall in the potential of the metallization BLN relative to the potential of the metallization BL and this leads to a potential difference ΔV, the reading of the sign of which makes it possible to determine the logic value of the data stored in the memory cell.

When the signal WLi is activated, a transient voltage spike PC occurs at node BN. It is then vital to prevent this voltage spike from being too large, and, in particular, greater than or equal to the threshold voltage of the storage transistors so as to prevent the transistor T3 from coming on. The effect of which would be to cause the voltage at the node B to drop and the transistor T4 to turn off, ultimately leading to a loss of the information stored, to a refreshing of the data in the "wrong direction" and consequently to the reading of data whose logic value is the inverse of that which had previously been written.

This is why the ratio $$R = \frac{W1}{L1} \bigg/ \frac{W2}{L2}$$

must be greater than or equal to 1, and, preferably, greater than or equal to 2. W1 and L1, respectively, denote the channel width and length of the storage transistors, while W2 and L2 denote the channel width and length of the access transistors. By way of indication for 0.35 $\mu$m CMOS technology, we shall preferably choose W1=1.4 $\mu$m, L1=0.4 $\mu$m, W2=0.8 $\mu$m and L2=0.5 $\mu$m thus leading to a ratio R on the order of 2.2.

The duration of the read cycle of such a memory cell is typically on the order of 30 ns, while the information refresh duration is much shorter. The refresh duration is typically on the order of 5 ns for a gate/source storage capacitance on the order of a few femtofarad and a stray bit line capacitance on the order of a few 100 femtofarad. Under these conditions, the memory structure according to the invention advantageously makes it possible to use extremely short specific refresh cycles.

Furthermore, the memory cell according to the invention does not require any dedicated fabrication process for constructing storage capacitors, and requires only three levels of metallization to construct it as an integrated circuit. A memory cell with a transistor requires five levels of metallization.

What is claimed is:

1. A dynamic random access memory device comprising:
    a plurality of dynamic memory cells organized in rows and columns, each dynamic memory cell comprising four insulated-gate field-effect transistors, said four insulated-gate field-effect transistors comprising
    first and second storage transistors both possessing a substantially same first ratio of channel width to channel length, and
    first and second access transistors connected to said first and second storage transistors, said first and second access transistors both possessing a substantially same second ratio of channel width to channel length,
    a ratio of the first ratio to the second ratio defining a third ratio greater than or equal to one.

2. A dynamic random access memory device according to claim 1, wherein the third ratio is greater than or equal to two.

3. A dynamic random access memory device according claim 1, wherein each dynamic memory cell further comprises:
    a first input and a second input for respectively receiving, during read and write phases, two control voltages; and
    a selection input for receiving a row selection voltage.

4. A dynamic random access memory device according claim 3, wherein the first access transistor has a source connected to the first input; wherein the second access transistor has a source connected to the second input, wherein the first access transistor has a drain connected to a drain of the first storage transistor and to a gate of the second storage transistor; wherein the second access transistor has a drain connected to a drain of the second storage transistor and to a gate of the first storage transistor; wherein sources of the first and second storage transistors are connected together and to a first bias voltage; and wherein gates of the first and second access transistors are connected to the selection input.

5. A dynamic random access memory device according to claim 4, wherein each of said storage and access transistors comprises an NMOS transistor.

6. A dynamic random access memory device according to claim 5, wherein each of said four insulated-gate field-effect transistors further comprises at least one substrate connected to a second predetermined bias voltage; and wherein a difference between the second bias voltage and the first bias voltage is negative or zero and greater than an additive inverse of threshold voltages of the transistors.

7. A dynamic random access memory device according to claim 4, wherein each of said storage and access transistors comprises a PMOS transistor.

8. A dynamic random access memory device according to claim 7, wherein each of said four insulated-gate field-effect transistors further comprises at least one substrate connected to a second predetermined bias voltage; and wherein a difference between the second bias voltage and the first bias voltage is positive or zero and less than a sum of the first bias voltage and the threshold voltages of the transistors.

9. A dynamic random access memory device according to claim 1, wherein each of said four insulated-gate field-effect transistors comprises at least one well.

10. A dynamic random access memory device according to claim 1, further comprising column metallization having stray capacitance; and wherein a ratio of the stray capacitance of the column metallization to the gate/source capacitance of each of the first and second storage transistors is at least equal to 50.

11. A dynamic random access memory device comprising:
    a plurality of dynamic memory cells organized in rows and columns, each dynamic memory cell comprising
    first and second storage transistors both possessing a substantially same first ratio of channel width to channel length, and
    first and second access transistors connected to said first and second storage transistors, said first and second access transistors both possessing a substantially same second ratio of channel width to channel length,
    a ratio of the first ratio to the second ratio defining a third ratio greater than or equal to one.

12. A dynamic random access memory device according to claim 11, wherein the third ratio is greater than or equal to two.

13. A dynamic random access memory device according claim 11, wherein each dynamic memory cell further comprises:
    a first input and a second input for respectively receiving, during read and write phases, two control voltages; and
    a selection input for receiving a row selection voltage.

14. A dynamic random access memory device according claim 13, wherein the first access transistor has a source connected to the first input; wherein the second access transistor has a source connected to the second input, wherein the first access transistor has a drain connected to a drain of the first storage transistor and to a gate of the second storage transistor; wherein the second access transistor has a drain connected to a drain of the second storage transistor and to a gate of the first storage transistor; wherein sources of the first and second storage transistors are connected together and to a first bias voltage; and wherein gates of the first and second access transistors are connected to the selection input.

15. A dynamic random access memory device according to claim 14, wherein each of said storage and access transistors comprises an NMOS transistor.

16. A dynamic random access memory device according to claim 15, wherein each of said storage and access transistors further comprises at least one substrate connected to a second predetermined bias voltage; and wherein a difference between the second bias voltage and the first bias voltage is negative or zero and greater than an additive inverse of threshold voltages of the transistors.

17. A dynamic random access memory device according to claim 14, wherein each of said storage and access transistors comprises a PMOS transistor.

18. A dynamic random access memory device according to claim 17, wherein said each of said storage and access transistors further comprises at least one substrate connected to a second predetermined bias voltage; and wherein a difference between the second bias voltage and the first bias voltage is positive or zero and less than a sum of the first bias voltage and the threshold voltages of the transistors.

19. A dynamic random access memory device according to claim 11, wherein each of said storage and access transistors comprises at least one well.

20. A dynamic random access memory device according to claim 11, further comprising column metallization having stray capacitance; and wherein a ratio of the stray capacitance of the column metallization to the gate/source capacitance of each of said storage transistors is at least equal to 50.

21. A dynamic random access memory device comprising:
a plurality of dynamic memory cells organized in rows and columns, each dynamic memory cell comprising
first and second storage insulated-gate field-effect transistors both possessing a substantially same first ratio of channel width to channel length, and
first and second access insulated-gate field-effect transistors connected to said first and second storage transistors, said first and second insulated-gate field-effect access transistors both possessing a substantially same second ratio of channel width to channel length,
a ratio of the first ratio to the second ratio defining a third ratio greater than or equal to one;
and
column metallization having stray capacitance so that a ratio of the stray capacitance of the column metallization to the gate/source capacitance of each of said storage transistors is at least equal to 50.

22. A dynamic random access memory device according to claim 21, wherein the third ratio is greater than or equal to two.

23. A dynamic random access memory device according claim 21, wherein each dynamic memory cell further comprises:
a first input and a second input for respectively receiving, during read and write phases, two control voltages; and
a selection input for receiving a row selection voltage.

24. A dynamic random access memory device according claim 23, wherein the first access transistor has a source connected to the first input; wherein the second access transistor has a source connected to the second input, wherein the first access transistor has a drain connected to a drain of the first storage transistor and to a gate of the second storage transistor; wherein the second access transistor has a drain connected to a drain of the second storage transistor and to a gate of the first storage transistor; wherein sources of the first and second storage transistors are connected together and to a first bias voltage; and wherein gates of the first and second access transistors are connected to the selection input.

25. A dynamic random access memory device according to claim 24, wherein each of said storage and access transistors comprises an NMOS transistor.

26. A dynamic random access memory device according to claim 25, wherein each of said storage and access transistors further comprises at least one substrate connected to a second predetermined bias voltage; and wherein a difference between the second bias voltage and the first bias voltage is negative or zero and greater than an additive inverse of threshold voltages of the transistors.

27. A dynamic random access memory device according to claim 24, wherein each of said storage and access transistors comprises a PMOS transistor.

28. A dynamic random access memory device according to claim 27, wherein said each of said storage and access transistors further comprises at least one substrate connected to a second predetermined bias voltage; and wherein a difference between the second bias voltage and the first bias voltage is positive or zero and less than a sum of the first bias voltage and the threshold voltages of the transistors.

29. A dynamic random access memory device according to claim 21, wherein each of said storage and access transistors comprises at least one well.

30. A method for making dynamic random access memory device comprising the steps of:
forming a plurality of dynamic memory cells organized in rows and columns, the step of forming each dynamic memory cell comprising
forming first and second storage transistors both possessing a substantially same first ratio of channel width to channel length, and
forming first and second access transistors connected to said first and second storage transistors, said first and second access transistors both possessing a substantially same second ratio of channel width to channel length so that a ratio of the first ratio to the second ratio defines a third ratio greater than or equal to one.

31. A method according to claim 30, wherein the third ratio is greater than or equal to two.

32. A method according to claim 30, further comprising the step of forming column metallization having stray capacitance so that a ratio of the stray capacitance of the column metallization to the gate/source capacitance of each of said storage transistors is at least equal to 50.

* * * * *

UNITED STATES PATENT AND TRADEMARK OFFICE
CERTIFICATE OF CORRECTION

PATENT NO. : US 6,177,694 B1
DATED : January 23, 2001
INVENTOR(S) : Noureddine El Hajji It is certified that error appears in the above-identified patent and that said Letters Patent is hereby corrected as shown below:

Column 3, Line 41    Delete: "$-VT \leq BIAS-AGND < 0$"

Insert-- $-VT \leq BIAS-\text{\AA}GND \leq 0$ --

Signed and Sealed this

Twenty-ninth Day of May, 2001

Attest:

NICHOLAS P. GODICI

*Attesting Officer*       *Acting Director of the United States Patent and Trademark Office*